(12) United States Patent
Hou et al.

(10) Patent No.: US 6,258,615 B1
(45) Date of Patent: Jul. 10, 2001

(54) METHOD OF VARYING A CHARACTERISTIC OF AN OPTICAL VERTICAL CAVITY STRUCTURE FORMED BY METALORGANIC VAPOR PHASE EPITAXY

(75) Inventors: Hong Q. Hou; Michael E. Coltrin; Kent D. Choquette, all of Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 09/191,070

(22) Filed: Nov. 12, 1998

(51) Int. Cl.⁷ ..................................................... H01L 21/00
(52) U.S. Cl. ................. 438/35; 438/29; 438/31; 438/956
(58) Field of Search ................. 438/29, 35, 956, 438/31; 117/104; 372/103, 97

(56) References Cited

U.S. PATENT DOCUMENTS 5,659,640 * 8/1997 Joyner ..................................... 385/14
5,960,024 * 9/1999 Li et al. ................................. 372/96

* cited by examiner

*Primary Examiner*—Stephen D. Meier
*Assistant Examiner*—Christy L. Novacek
(74) *Attorney, Agent, or Firm*—Gregory A. Cone

(57) ABSTRACT

A process for forming an array of vertical cavity optical resonant structures wherein the structures in the array have different detection or emission wavelengths. The process uses selective area growth (SAG) in conjunction with annular masks of differing dimensions to control the thickness and chemical composition of the materials in the optical cavities in conjunction with a metalorganic vapor phase epitaxy (MOVPE) process to build these arrays.

8 Claims, 3 Drawing Sheets

METHOD OF VARYING A CHARACTERISTIC OF AN OPTICAL VERTICAL CAVITY STRUCTURE FORMED BY METALORGANIC VAPOR PHASE EPITAXY

STATEMENT REGARDING FEDERALLY FUNDED RESEARCH OR DEVELOPMENT

This invention was made with Government support under Contract DE-AC04-94AL85000 awarded by the U.S. Department of Energy. The Government has certain rights in the invention.

CROSS-REFERENCE TO RELATED APPLICATIONS

Not Applicable.

BACKGROUND OF THE INVENTION

This invention relates to methods of forming vertical resonant cavity optical structures upon a substrate. More particularly, this invention relates to a method for precisely varying at least one characteristic of such structures between individual laterally displaced structures on the substrate. The characteristics include wavelength of emission or detection, bandgap energy, thickness of layers within the structures, chemical composition of the layers within the structures, and lateral variation of the amounts of different elements within a layer.

The structures are vertical-cavity resonance optoelectronic devices and include vertical-cavity surface-emitting lasers (VCSELs), resonance-cavity photodetectors (RCPDs) and Fabry-Perot cavity modulators (FPCMs) that are useful in optical communications and sensing. A 1- or 2-dimensional (2D) device array emitting, detecting, or modulating light at different wavelengths enables many unique applications. For instance, a VCSEL array with different wavelengths can be used for wavelength-division multiplexing (WDM) fiber-optic communication systems. Different wavelengths from different array elements can be coupled in a single fiber for transmission over a distance. Each wavelength can be differently encoded and a de-multiplexing system at the receiving end can separate the different channels. Such a scheme can greatly enhance the transmission capacity. A VCSEL array WDM system is ideal for campus-wide short-haul applications. In addition, such an array has been demonstrated to be very useful for reconfigurable multiple chip module free-space interconnects. An array of RCPDs sensitive to different wavelengths enables a compact and integrated multi-channel spectroscopic analysis microsystem for quantitative fast parallel optical sensing. The detectors consist of a closely-spaced resonance-cavity detector array. Each element in the array is only sensitive to a specific wavelength of the broadband irradiation. Therefore, the array is equivalent to an integration of a spectrometer and a detector array. An array of FPCMs also offers a unique capability for multiple wavelength communication systems.

The central part of the resonance cavity devices is the optical cavity embedded between two distributed Bragg reflector (DBR) mirrors. The wavelength of emission, detection, or modulation is dictated by the Fabry-Perot mode of the cavity, which is determined in turn by the optical thickness (the product of layer thickness with the refractive index) of the cavity. The operating wavelength will be changed if the thickness of the optical cavity is changed.

It would be desirable to be able to fabricate an array of resonant-cavity devices from a single growth with a reliable manufacturing process. Such a process would require lateral variation of the layer thickness and alloy composition in these complex, multi-layer resonant structures. Prior to the invention of the process disclosed herein, no such process was known to exist.

Selective area growth (SAG) by metalorganic vapor phase epitaxy (MOVPE) has proved to be a viable technique for the lateral definition of the thickness, composition, and bandgap energy of semiconductor material at different regions of the same wafer. The substrate (or base epitaxial structure) can be partially masked by dielectric materials, such as $SiO_2$, $SiN_x$, and $SiON_x$, and perfect selectivity of the growth (no growth occurs on the mask material) can be achieved for many III–V materials under certain growth conditions. The growth selectivity redistributes the flux of reactant gases in the MOVPE growth, and diverts the metalorganic materials from the mask region into the open area. Different degrees of enhancement or modulation of the thickness and alloy composition can be achieved on the same wafer nearby the different mask patterns by varying the dimensions of the masked area. SAG technique has been used for optoelectronic/photonic integration of laser-modulators, multiple-wavelength (ID) laser-passive waveguides, laser-detectors, and other similar linear stripe structures. See for example, U.S. Pat. Nos. 5,704,975; 5,728,215; 5,770,466; and 5,828,085.

Review of the literature indicates that little has been done on the demonstration of multiple wavelength RCPDs and FPCMs. However, several approaches have been reported in making WDM VCSELs. Chang-Hasnain et al reported a successful fabrication of a multi-element VCSEL array with wavelength space ~3 nm between the neighboring elements in the array. C. J. Chang-Hasnain, J. P. Harbison, C. E. Zah, M. W. Maeda, L. T. Florez, N. G. Stoffel, and T. P. Lee, "Multiple wavelength tunable surface-emitting laser arrays," IEEE J. Quant. Electron. vol. 27, pp. 1368, 1991. Their approach was to use the inherent nonuniformity of the beam flux profile in molecular beam epitaxy (MBE) growth. Substrate rotation, which is used to average out the material nonuniformity, was stopped during the growth of the cavity. Therefore, different cavity wavelengths were achieved using the tapered cavity thickness. Since the degree of the taper critically depends on the substrate position relative to the sources, this approach has problems with the producibility of the absolute wavelength and wavelength spacing.

The second approach is to etch grooves on the backside of the substrate for MBE growth. W. Yuen, G. S. Li, and D. J. Chang-Hasnain, "Multiple-wavelength vertical-cavity surface-emitting laser arrays with a record wavelength span," IEEE Photon. Technol. Lett. vol. 8, pp. 4–7, 1996. The substrate is then mounted to a Mo holder with In solders. The differential thermal contact creates a temperature profile near the edge of the etched groove. When the growth temperature is high enough, the material in the cavity region creates a thickness profile due to differing degrees of thermal desorption. Therefore, different wavelengths can be achieved.

The third approach is to pattern and etch the substrate with different sizes (and depths) of mesas. F. Koyama, T. Mukaihara, Y. Hayashi, N. Ohnoki, N. Hatori and K. Iga, "Wavelength control of vertical-cavity surface-emitting lasers by using nonplanar MOCVD," IEEE Photon Technol. Lett. vol. 7, pp. 10–12, 1995, and G. G. Ortiz, J. Cheng, S. Z. Sun, H. Q. Hou, and B. E. Hammons, "Monolithic, multiple wavelength vertical-cavity surface-emitting laser arrays by surface-controlled MOCVD growth rate enhancement and reduction," IEEE Photon. Technol. Lett. vol. 9, pp. 1066–1068, 1997. The topographical difference causes differences in the surface diffusion process and, therefore, creates a cavity thickness variation for different lasing wavelengths. Wavelength difference was obtained from different mesas. This approach lacks the accuracy of the wavelength control and introduces a topographical profile, making it difficult to process. Another major problem with these approaches is the narrow operable temperature range. Since all the lasers with a large wavelength span share the same active region of the quantum wells, the optimum operating temperature for each element is very different. This results in a very narrow temperature region of the quantum wells, the optimum operating temperature for each element is very different. This results in a very narrow temperature region within which the operation of all the lasers can be achieved.

However, WDM VCSELs meeting the specification of the wavelength accuracy, spacing, and device performance are becoming more desirable for fiber-optic communications than ever before. For example, a LAN project sponsored by the U.S. Government required a 1×4 array with wavelength spacing of 15 nm between the neighboring channels. Currently, the laser array is rather inelegantly achieved by using 4 discrete devices from 4 individually optimized runs. Clearly, an integrated device with suitable performance would be superior if one could be made. For a practical application of WDM VCSELs, the critical issues include a predefined wavelength spacing, absolute wavelength accuracy for each element, and uniformity of the device performance. The current state of the art of technologies cannot satisfy these demands. It would be very desirable if the gain wavelength for each individual element of such a laser array "tracks" the laser wavelength so that a uniform device performance over a range of wavelengths can be achieved. None of the prior art above teaches a method to successfully form these individual elements in 1 or 2 dimensional arrays.

BRIEF SUMMARY OF THE INVENTION

The thickness and chemical composition and the resulting wavelengths of emission or detection or bandgap of the active region of a resonant cavity can be laterally varied across an array of vertical cavity resonant structures by careful design of the annular dielectric masks and selection of the precursor chemicals used in the MOCVD technique. Use of the annular masks enables the fabrication of the individual elements in the array. In cases where the dielectric masks disrupt the needed selectivity of chemical deposition of the layers in the distributed Bragg reflector layers, the bottom DBR layers for the bottom mirror are formed without the dielectric masks to create a uniform thickness DBR across the substrate. The dielectric masks are then formed on top of the lower DBR mirror structure, and the active regions of the various individual resonant cavity structures are formed. The upper DBR mirror is then formed on top of the individual active regions in another uniform layer. The individual devices are later defined as individual elements in an array by selective etching.

DETAILED DESCRIPTION OF THE INVENTION

Figure 1:
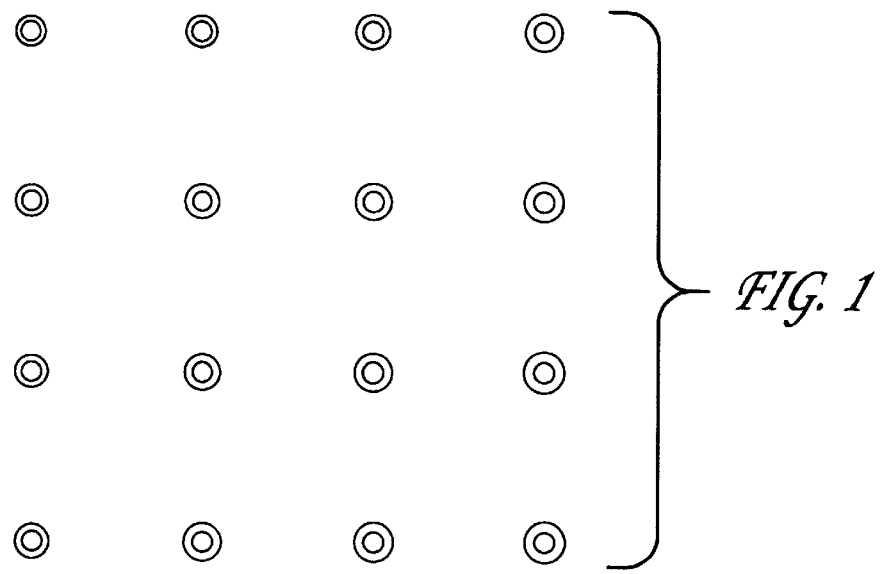
FIG. 1 is a plan view diagram of a dielectric mask pattern, showing a 4×4 array of annular masks having the same inner opening diameter (120 $\mu$m) but varying outer diameters. The structures are spaced 1 mm apart to avoid interference therebetween.
Figure 2:
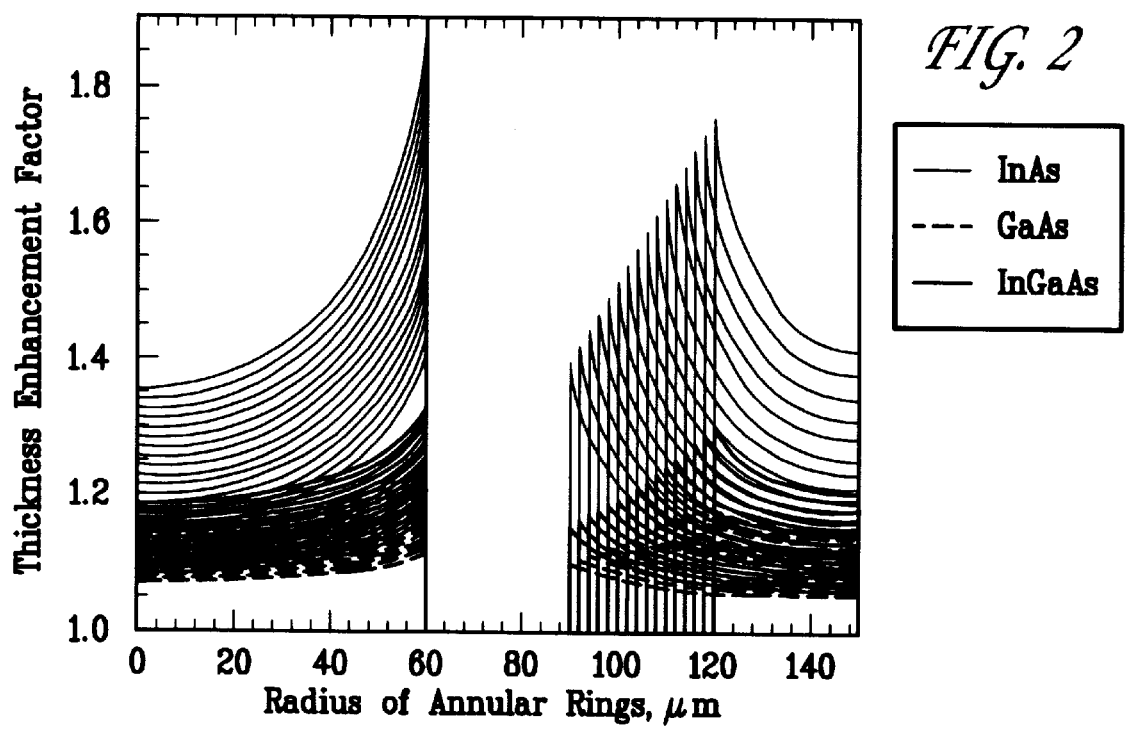
FIG. 2 is a graph showing the variation of the thickness enhancement factor as a function of the radius of an annular ring for three different III–V compound semiconductor materials.

One embodiment of the present invention is a 2-dimensional VCSEL array that was built by applying the SAG technique to MOVPE. The variation of the mask geometry (e.g., the mask area/shape or the open area/shape) leads to a variation of the layer thickness and alloy compositions. The variation of the mask geometry can be in linear dimension or circumference (in the case of circular masks). Here we consider an example of an annular pattern of doughnut shape. Shown in FIG. 1 is a 4×4 array of the annular rings with the same inner opening-area diameter of 120 $\mu$m. The difference in the width of the rings (masked area) leads to a difference in the thickness of the material inside the ring. We have used a two-dimensional steady-state finite-difference calculation to model the flux of materials on the masked and exposed areas. FIG. 2 shows the thickness profile in the open area of the substrate for the different patterns calculated for InAs, GaAs and $In_{0.18}Ga_{0.82}As$ using trimethylgallium (TMG) and trimethylindium (TMI) as the metalorganic sources. The growth pressure and growth temperature were 60 torr and 720° C., respectively, for this calculation. The thickness enhancement factor is normalized to the growth thickness on a featureless planar substrate. Since the source depletes almost exponentially away from the edge of the mask, the thickness varies over the whole radius of the feature. Use of the annular pattern helps to form a flatter profile in the open area. When the source material diffuses inward from the ring, although the amount of the source material decays, the flux density of the material increases as the cross section decreases when the radius is reduced. This effect can be qualitatively demonstrated as follows: $exp(-ar)/2\pi r \sim a_1 + a_2 r + a_3 1/r + \ldots$ Compared with an exponentially decayed profile for linear mask, this dependence on r produces a flatter profile of the thickness of annular pattern.

Figure 3:
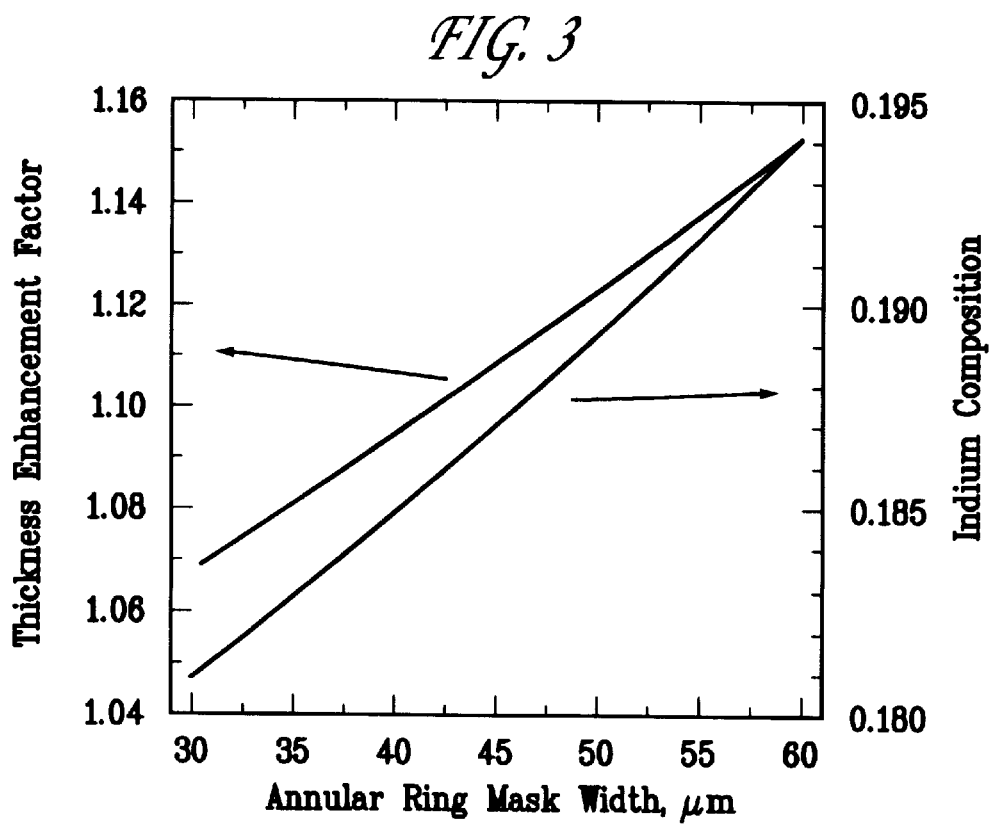
FIG. 3 is a graph showing the variation in thickness enhancement factor and indium composition variation as a function of the width of the annular ring. Nominal thickness and In composition on a planar wafer are 1 and 0.18 respectively.

As shown in FIG. 2, the GaAs and InAs thickness are enhanced by very different amounts, being much steeper for InAs and GaAs, as a result of the difference in diffusion constants of the TMG and TMI. FIG. 3 shows the thickness enhancement factor and the In composition variation of InAsAs in the middle of the ring. The thickness variation was designed to be in a range of ~8% so that ~70 nm of variation of cavity wavelength can be achieved. Because of the difference in the diffusion rates of TMI and TMG, the In composition also varies from 0.181 to 0.194. This can be extremely useful in defining different emission wavelengths for the gain of the quantum well active region.

Figure 4:
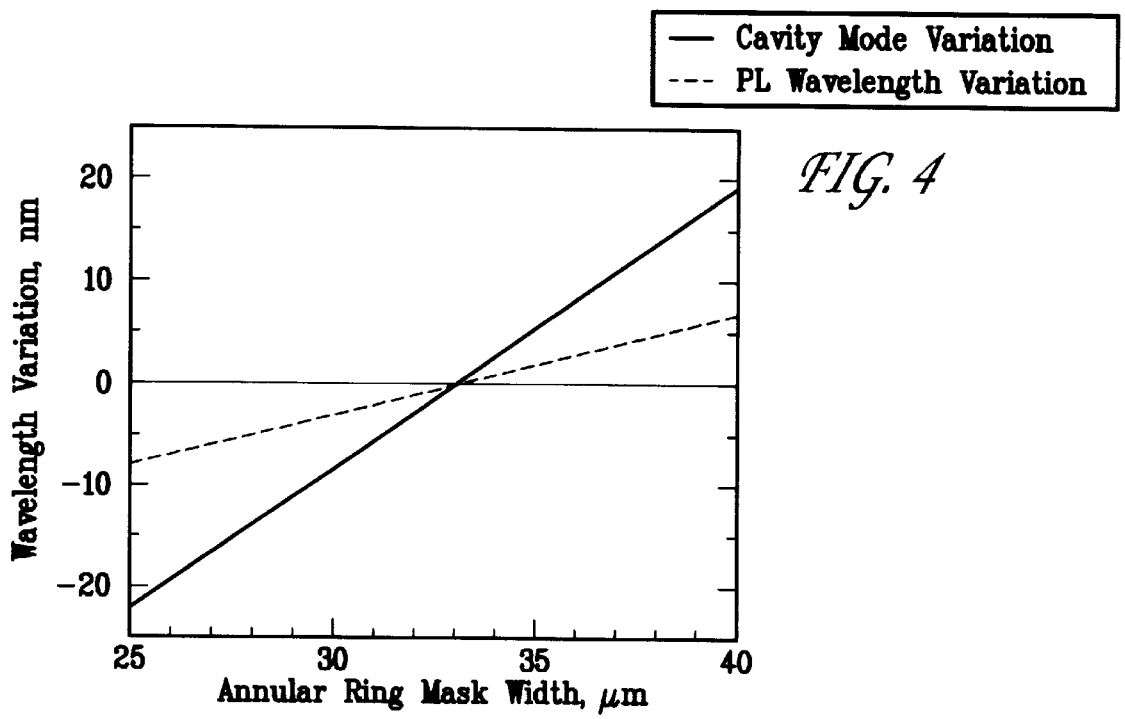
FIG. 4 is a graph showing wavelength variation (Fabry-Perot cavity wavelength and modeled emission wavelength) as a function of annular ring width. The variations result from enhancement of thickness and In composition caused by varying ring mask width.

FIG. 4 shows the calculated cavity wavelength variation due to the thickness variation. The width of the mask was designed to achieve a total variation of the lasing wavelength of 40 nm. (The stopband width of GaAs/$Al_{0.94}Ga_{0.06}As$ is usually ~100 nm, so all the wavelengths are still covered within the single DBR structure). However, if the gain wavelength doesn't change with the operating wavelength, the overlap of the gain with the cavity mode can vary significantly for the different elements of the array. As a result, the performance of the devices will be compromised, and they will only be able to run in a narrow temperature range. For the growth of an InGaAs quantum well, the In composition varies in the center of the doughnut, as shown in FIG. 3, in addition to the thickness. The variation in emission energy from the quantum wells with different In compositions and well thickness are calculated and plotted in FIG. 4 with the dotted line for the ring pattern. The emission wavelength moves in the same direction as the cavity wavelength modulated by the thickness variation, although they do not change at exactly the same rates. With further optimization on the mask geometry, we can obtain an even better "tracking" of the two wavelengths. Therefore, the SAG by MOVPE provides not only a variation of the cavity wavelength, but also a wavelength "tracking" between the cavity mode and the emission wavelength to ensure similar performances of the VCSELs in the same array over a good temperature range. Because the diffusion constants of TMA and TMG are about the same, a variation of the composition in AlGaAs may not be achievable for AlGaAs which is important for 780 and 850-nm VCSELs. We can utilize strained InGaAlAs (as taught by J. Ko, E. R. Hegblomer, Y. Akulova, J. J. Thibeault, L. A. Coldren, "Low-threshold 840-nm laterally oxidized vertical-cavity lasers using AlInGaAs-AlGaAs strained active layers," IEEE Photon. Technol. Lett. vol. 9, pp. 863–865, 1997, incorporated herein by reference) or InGaAsP active region for these wavelengths, or AlGaAs grown with triethylgallium (TEG) and TMA since the diffusion constants for these two precursors differ more.

Figure 5:
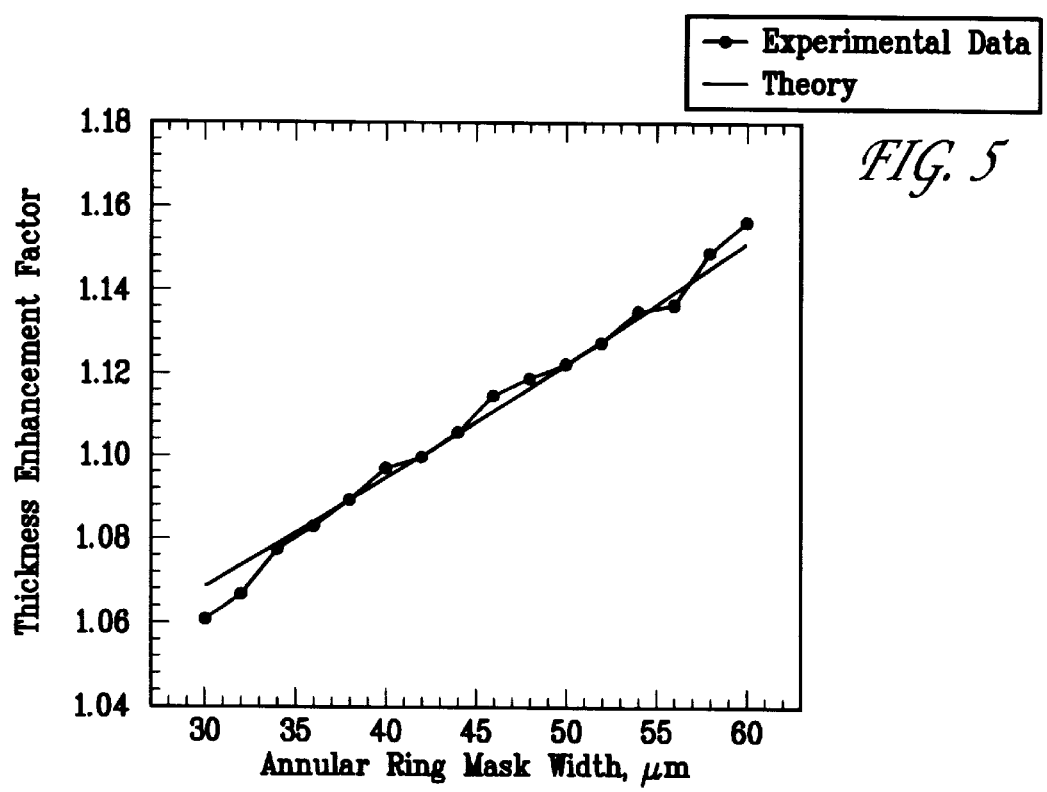
FIG. 5 is a graph showing thickness enhancement at the center of the rings as a function of the width of the annular rings.

We have grown InGaAs/GaAs and GaAs/AlGaAs quantum wells embedded in AlGaAs cladding layers for the active region of VCSELs, and performed thickness profile and photoluminescence (PL) measurements for different doughnut dimensions. Perfectly selective growth on the annular pattern was achieved on the dielectric mask. FIG. 5 shows the thickness in the middle of the ring for the growth of InGaAs/GaAs quantum wells with AlGaAs cladding layers for 980-nm VCSELs as a function of the mask width. The thick solid line represents the model calculation for the thickness enhancement, and the solid circles are measured thickness. The experimental results are in an excellent agreement with the calculation. In order to enhance the contrast of the DBR layers for mirrors, the low-index material in the DBR is typically high Al composition AlGaAs or AlAs. Unfortunately, it is extremely difficult to achieve a perfect selectivity of AlAs on the dielectric mask. Therefore, a bottom DBR is grown first, the sample is then unloaded for patterning of the dielectric mask. This is followed by a SAG of the active region and the top DBR can then be grown on atop. We have demonstrated that the VCSEL performance from the selective area regrowth is almost identical to that from a single growth. The remaining steps for forming a VSCEL array are accomplished in a conventional manner, i.e. vertical etching to form the individual VCSEL elements, formation of electrodes, etc.

In order to achieve the wavelength variation and accuracy in a controlled manner, the growth has to be extremely uniform. We have demonstrated a uniformity of the laser cavity wavelength of better than 0.5%, or 5 nm for 980 nm VCSELs. The wavelength accuracy can be further improved by in situ control using normal-incidence reflectance as the sensor (see W. G. Breiland, H. Q. Hou, H. C. Chui, and B. E. Hammons, "In situ pregrowth calibration using reflectance as a control strategy for MOCVD fabrication of device structures," J. Cryst. Growth, vol. 174, pp. 564–568, 1997, incorporated by reference herein). The simulation of the growth rate enhancement in this work assumes that the crosstalk of the gas-phase diffusion is negligible because the features are separated far enough. This provides a valuable guideline for mask design. A more complete case including arbitrary shape of the dielectric mask pattern and boundary conditions can be accounted for by a massive parallel numerical code, called MP-SALSA, and an accurate determination of the enhancement for any shape of patterns placed in any distance including the crosstalk effect can be predicted.

In other embodiments of the present invention, two or more vertical optical resonant cavity structures can be formed using annular mask patterns with different inner diameters.

Figure 6:
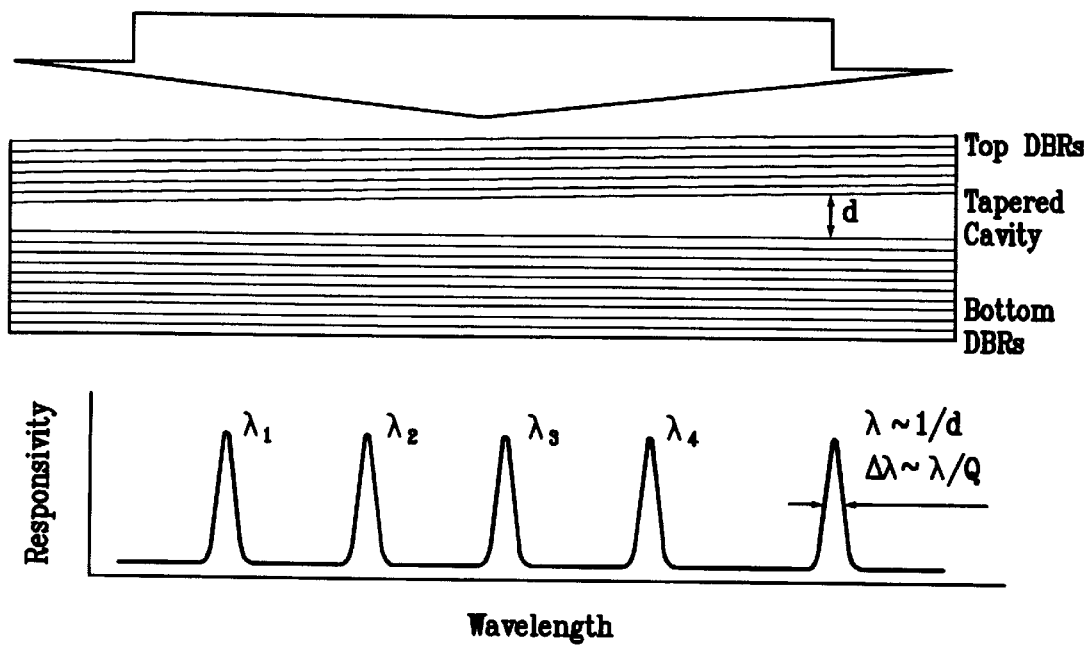
FIG. 6 is a schematic diagram of a wavelength-selective RCPD array showing responsivity peaks at different wavelengths for elements with different cavity thicknesses.

For the fabrication of the RCPDs, the responsivity can be very high because of multiple paths through the active region. The spectral width of the detection is determined by the Q of the cavity, $\Delta\lambda=\lambda/Q$. For instance, $\Delta\lambda$~1 nm for 980 nm wavelength if the Q of the cavity is ~1000, which is readily achievable with the DBR mirrors. Variation of the resonance wavelength is again achieved by SAG. A schematic diagram of the detector array is shown in FIG. 6. The tapered thickness is produced here by a linear mask that is configured in a V shape with equal widths on the arms of the V. The thickest portion of the cavity forms at the narrow end of the V, and the cavity thickness decreases as the V opens up. Alternatively, this structure could be formed between parallel linear edges of two trapezoidal-shaped mask strips. Here the thickest portion of the optical cavity would be formed adjacent to the portions of the mask strips having the greatest width. A combination of these two masking techniques could also be employed. This densely packed detector array, sensitive to only a narrow wavelength range for each element, can function as a combination of bulky spectral dispersive device and a detector array, will be very appealing for a compact sensing system application.

Although the invention has been described in the context of the VCSEL and RCPD structures set forth above, the true scope of the invention is not limited thereto or the specific chemical elements recited but is to be found in the appended claims.

What is claimed is:

1. A method for forming at least two vertical optical resonant cavity structures on a substrate with differing cavity characteristics comprising:
    providing a base surface suitable for metalorganic vapor phase epitaxial deposition;
    creating at least two different annular mask patterns on the base surface wherein:
        the mask patterns are formed from a dielectric material onto which a set of semiconductor materials will not deposit, and
        the inner diameters or the annular widths of the at least two different mask patterns are different; and
    depositing multiple layers of the set of semiconductor materials onto the base surface to form the vertical resonant cavity structures.

2. The method of claim 1 wherein the differing characteristic is vertical thickness of the resonant optical cavities, the bandgap of the cavities, the detection wavelengths of the cavities, the emission wavelengths of the cavities, the chemical composition of the deposited compound semiconductors in the cavities, or the lateral variation of the chemical composition of within a cavity as between different cavities.

3. The method of claim 1 additionally comprising forming a distributed Bragg reflector mirror structure as the base surface for subsequent deposition of the dielectric mask patterns thereupon.

4. The method of the claim 1 wherein the resonant optical cavity includes a quantum well active region.

5. The method of claim 1 wherein the dielectric material is $SiO_2$, $SiN_x$, or $SiON_x$.

6. The method of claim 1 wherein the annular masks define a one-dimensional array of vertical cavity structures.

7. The method of claim 1 wherein the annular masks define a two-dimensional array of vertical cavity structures.

8. The method of claim 1 wherein the set of semiconductor materials are the III–V compound semiconductor materials.

* * * * *